(12) United States Patent
Anderton

(10) Patent No.: US 9,998,082 B1
(45) Date of Patent: Jun. 12, 2018

(54) COMPARATIVE BALANCING

(71) Applicant: Gibson Brands, Inc., Nashville, TN (US)

(72) Inventor: Craig Anderton, Nashville, TN (US)

(73) Assignee: Gibson Brands, Inc., Nashville, TN (US)

( * ) Notice: Subject to any disclaimer, the term of this patent is extended or adjusted under 35 U.S.C. 154(b) by 0 days. days.

(21) Appl. No.: 15/407,101

(22) Filed: Jan. 16, 2017

(51) Int. Cl.
*H03G 9/00* (2006.01)
*H03G 3/30* (2006.01)
*G06F 3/16* (2006.01)

(52) U.S. Cl.
CPC ............ *H03G 3/301* (2013.01); *G06F 3/165* (2013.01)

(58) Field of Classification Search
CPC ................................ H03G 3/301; G06F 3/165
USPC .................................................. 381/102, 58
See application file for complete search history.

(56) References Cited

U.S. PATENT DOCUMENTS

| | | | | |
|---|---|---|---|---|
| 5,228,093 A | * | 7/1993 | Agnello | G01R 23/16 381/103 |
| 2005/0063552 A1 | * | 3/2005 | Shuttleworth | H03G 3/32 381/57 |
| 2006/0106472 A1 | * | 5/2006 | Romesburg | G11B 20/10527 700/94 |
| 2013/0308800 A1 | * | 11/2013 | Bacon | F25D 23/063 381/300 |
| 2016/0307581 A1 | * | 10/2016 | Salmela | G10L 21/034 |

* cited by examiner

*Primary Examiner* — Vivian Chin
*Assistant Examiner* — Ubachukwu Odunukwe
(74) *Attorney, Agent, or Firm* — Bates & Bates LLC

(57) ABSTRACT

In an example embodiment, an audio device is provided with one or more processors and a computer-readable tangible medium with instructions stored thereon that, when executed, direct the one or more processors to access a target audio file and access a set of evaluated levels associated with one or more preset frequency bands in the target audio file. The computer-readable tangible medium also has instructions that direct the processor to create a set of comparatively balanced levels by comparatively balancing a set of actual levels associated with the one or more preset frequency bands in the target audio file to at least approximate a set of reference levels associated with the one or more preset frequency bands. The computer-readable tangible medium further has instructions that direct the processor to play the target audio file with the set of comparatively balanced levels.

15 Claims, 7 Drawing Sheets

COMPARATIVE BALANCING

BACKGROUND

Many modern consumers enjoy listening to audio files on a variety of devices such as computers, cellphones, tablets, etc. Often consumers interact with playlists of audio files from a variety of artists recorded with considerably different equalization and level settings. In many instances these equalization and level settings can be so disparate that transitions between songs in the playlist can be annoying and distracting, thus unpleasantly degrading the listening experience for consumers. Attempts have been made to ameliorate at least some of these issues through dynamics processing, however this often results in undesirable side effects including artifacts, altered dynamic ranges, failure to compensate for timbre variations, uneven amounts of compression applied depending on the program material itself, etc.

SUMMARY

In an example embodiment, a computer-readable tangible medium has instructions stored thereon that, when executed, direct a processor to access a set of reference levels associated with one or more preset frequency bands and access a target audio file. The computer-readable tangible medium also has instructions that direct the processor to access a set of evaluated levels of the one or more preset frequency bands associated with the target audio file, and isolate one or more differences between the set of evaluated levels and the set of reference levels. The computer-readable tangible medium further has instructions that direct the processor to utilize the one or more differences to alter a set of actual levels of the one or more preset frequency bands of the target audio file to create a set of comparatively balanced levels of the one or more preset frequency bands of the target audio file, which at least approximates the set of reference levels, and play the target audio file using the set of comparatively balanced levels to create a comparatively balanced audio signal.

In another example embodiment, an audio device is provided with one or more processors and a computer-readable tangible medium, with instructions stored thereon, that direct the one or more processors to access a set of evaluated levels associated with one or more preset frequency bands in a target audio file, and create a set of comparatively balanced levels associated with one or more preset frequency bands in the target audio file by comparatively balancing a set of actual levels associated with the one or more preset frequency bands in the target audio file to at least approximate a set of reference levels associated with the one or more preset frequency bands in a reference template.

In yet another example embodiment, an audio device is provided with one or more processors and a computer-readable tangible medium with instructions stored thereon that, when executed, direct the one or more processors to access a target audio file and access a set of evaluated levels associated with one or more preset frequency bands in the target audio file. The computer-readable tangible medium also has instructions that direct the processor to create a set of comparatively balanced levels by comparatively balancing a set of actual levels associated with the one or more preset frequency bands in the target audio file to at least approximate a set of reference levels associated with the one or more preset frequency bands. The computer-readable tangible medium further has instructions that direct the processor to play the target audio file with the set of comparatively balanced levels.

This summary is not intended to identify key or essential features of the claimed subject matter, nor is it intended to be used as an aid in limiting the scope of the claimed subject matter.

Other features of the current disclosure will become apparent to those skilled in the art upon review of the following drawings, the detailed description, and the appended claims.

BRIEF DESCRIPTION OF THE DRAWINGS

Illustrative embodiments will be described referring to the accompanying drawings, wherein like numerals denote like elements.

DETAILED DESCRIPTION

In the following description, numerous details are set forth to provide an understanding of some embodiments of the present disclosure. However, it will be understood by those of ordinary skill in the art that the systems and/or methodologies may be practiced without these details and that numerous variations or modifications from the described embodiments may be possible.

As described herein, various techniques and technologies associated with comparative balancing can be used to comparatively balance levels, tone, and timbre among audio files being played by a user, resulting in a more uniform listening experience. In one possible implementation, such comparative balancing can be accomplished by matching the levels of various frequency bands in the audio files to a set of reference levels associated with those same frequency bands.

Example Computing Device(s)

Figure 1:
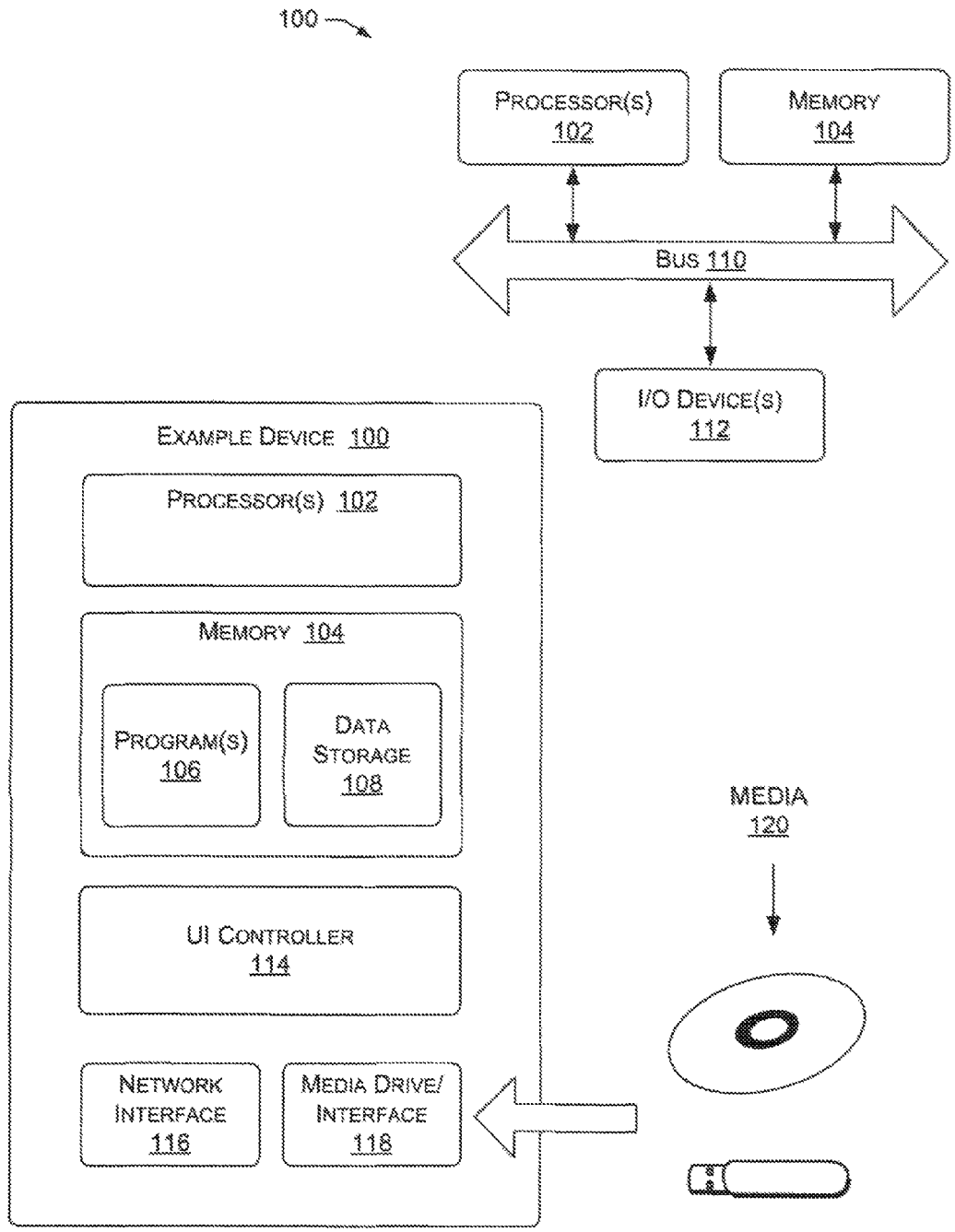
FIG. 1 illustrates an example computing device that can be used in accordance with various implementations of comparative balancing.

FIG. 1 illustrates an example device 100, with one or more processor(s) 102 and memory 104 for hosting a variety of programs 106, including programs configured to implement various embodiments of comparative balancing as discussed in this disclosure. In one possible implementation, various audio devices described herein may include all or portions of example device 100. Such audio devices can include anything configured to play and/or alter audio signals, such as, for example, a public address system (including a mixing board,), a hearing aid, a telephone, a speaker, one or more headphones, a computer, a DJ control setup that enables a DJ to play and/or alter music, a musical instrument, a television, an internet-based music streaming service, an entertainment system, etc.

Memory 104 can also host data storage 108 such as, for example, one or more databases, and a variety of data discussed herein. Memory 104 can include one or more forms of volatile data storage media such as random access memory (RAM), and/or one or more forms of nonvolatile storage media (such as read-only memory (ROM), flash memory, and so forth). Further, memory 104 can be located in device 100, remote from it (such as, for example, as cloud-based memory), or any combination thereof.

Device 100 is one example of a computing device or programmable device, and is not intended to suggest any limitation as to scope of use or functionality of device 100 and/or its possible architectures. For example, device 100 can comprise one or more computing devices, programmable logic controllers (PLCs), etc.

Further, device 100 should not be interpreted as having any dependency relating to one or a combination of components illustrated in device 100. For example, device 100 may include one or more of a computer, such as a laptop computer, a desktop computer, a mainframe computer, a cell phone, an audio mixer, a musical instrument, a simple on chip computing device, etc., or any combination or accumulation thereof.

Device 100 can also include a bus 110 configured to allow various components and devices, such as processor(s) 102, memory 104, and data storage 108, among other components, to communicate with each other. In one possible implementation, all or portions of data storage 108 can exist within memory 104.

Bus 110 can include one or more of any of several types of bus structures, including a memory bus or memory controller, a peripheral bus, an accelerated graphics port, and a processor or local bus using any of a variety of bus architectures. Bus 110 can also include wired and/or wireless buses.

Data storage 108 can include fixed media (e.g., RAM, ROM, a fixed hard drive, etc.), removable media (e.g., a flash memory drive, a removable hard drive, optical disks, magnetic disks, and so forth), remote storage (e.g. cloud storage), or any combination or accumulation thereof.

One or more input/output (I/O) device(s) 112 may also communicate via a user interface (UI) controller 114, which may connect with I/O device(s) 112 either directly or through bus 110.

In one possible implementation, a network interface 116 may communicate outside of device 100 via a connected network, and in some implementations may communicate with hardware, etc.

In one possible embodiment, various equipment may communicate with device 100 as input/output device(s) 112 via bus 110, for example.

A media drive/interface 118 can accept removable tangible media 120, such as flash drives, optical disks, removable hard drives, software products, etc. In one possible implementation, logic, computing instructions, software programs comprising elements of program(s) 106, and/or data (including, for example, audio files) may reside on removable media 120 readable by media drive/interface 118.

In one possible embodiment, input/output device(s) 112 can allow a user to enter commands and information to device 100, and also allow information to be presented to the user and/or other components or devices. Examples of input device(s) 112 include, for example, sensors, a keyboard, a cursor control device (e.g., a mouse), a microphone, a scanner, a musical instrument, a touch screen, and any other input devices known in the art. Examples of output devices include a display device (e.g., a monitor or projector), speakers, a printer, a network card, and so on.

Various processes of program(s) 106 may be described herein in the general context of software or program modules, and/or the techniques and modules may be implemented, all or in part, in computing hardware. Software generally includes routines, programs, objects, components, data structures, and so forth that perform particular tasks or implement particular abstract data types. An implementation of these modules and techniques may be stored on or transmitted across some form of tangible computer-readable media. Computer-readable media can be any available data storage medium or media that is tangible and can be accessed by a computing device. Computer-readable media may thus comprise computer storage media. "Computer storage media" designates tangible media, and includes volatile and non-volatile, removable and non-removable tangible media implemented for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other tangible medium which can be used to store the desired information, and which can be accessed by a computer.

Figure 2:
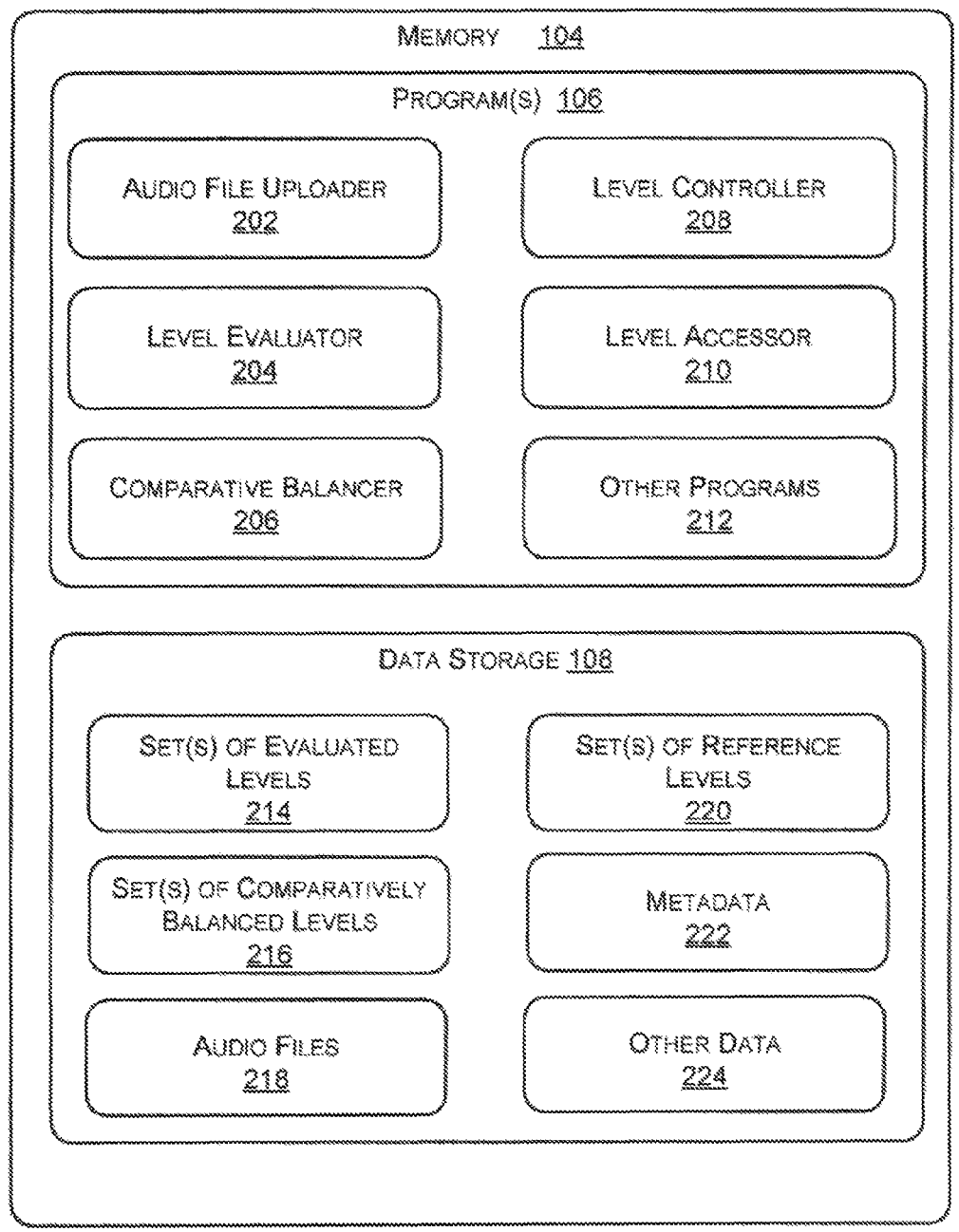
FIG. 2 illustrates example programs and data that can be used in accordance with various implementations of comparative balancing.

FIG. 2 illustrates an example configuration of memory 104 comprising computer-readable media including program(s) 106 and data storage 108 configured to implement various embodiments of comparative balancing as discussed in this disclosure. Memory 104 can provide any storage mechanisms known in the art to store various information, data and/or instructions such as program(s) 106 (including any types of software known in the art) and any other types of information and data related to operational aspects of device 100. For example, program(s) 106 stored in memory 104 can include an audio file uploader 202, a level evaluator 204, a comparative balancer 206, a level controller 208, a level accessor 210, and other programs 212—such as an operating system and/or assorted application programs. Program(s) 106 can be executed on processor(s) 102.

Memory 104 can also include data storage 108 on which can be stored, for example, information such as set(s) of evaluated levels 214, set(s) of comparatively balanced levels 216, audio files 218, set(s) of reference levels 220, metadata 222, and other data 224 (including intermediate and final data created through use of one or more of program(s) 106).

Any of program(s) 106 and data in data storage 108 can reside wholly or partially on any of a variety of media types found in memory 104 and/or media 120. For example portions of audio file uploader 202 can reside at different times in random access memory (RAM), read only memory (ROM), optical storage discs (such as media 120), floppy disks, cloud memory, optical devices, flash devices, etc. Alternately, or additionally, some or all of program(s) 106 may be implemented through use of other functionality, such as electronic circuitry, etc.

Example Techniques, Processes, Etc.

Figure 3:
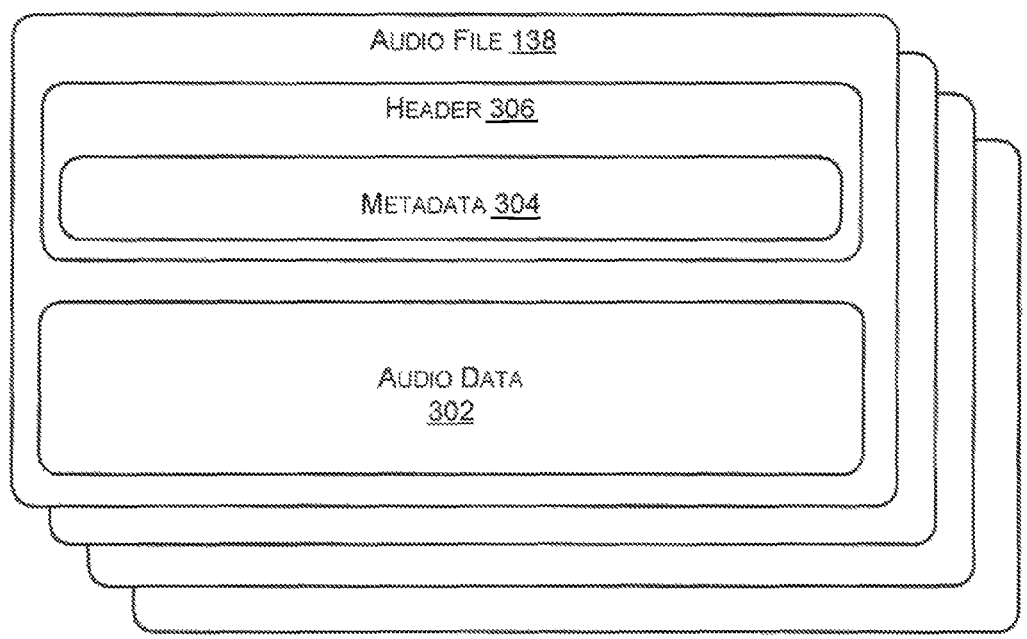
FIG. 3 illustrates example audio files associated with various embodiments of comparative balancing.

FIG. 3 illustrates an example set of audio files 138 in accordance with various implementations of comparative balancing. In one possible implementation, the set of audio files 138 may be part of a library and/or playlist being listened to by a user of device 100. In another possible example, the set of audio files 138 can be audio files that a user may be downloading to and/or from device 100.

Audio files 138 can include any types of audio files and/or signals known in the art, and can be accessed by device 100 in any manner known in the art including, for example, downloading from the Internet, downloading from media 120, receiving from a microphone or other audio receiving device, etc. For example, in the instance of a real time signal (such as a telecommunications signal, one or more people talking and/or singing into a microphone, etc.), audio file 138 can include a real-time stream of audio data, such as a phone conversation and/or a performance by one or more people. One or more of audio files 138 can also be created and/or altered on device 100.

In one possible implementation, one or more of audio files 138 can include audio data 302 and a set of metadata 304 associated with one or more aspects of audio files 138. Metadata 304 can include, for example, title information, composer information, copyright owner information, etc., associated with audio data 302. Metadata 304 can also include information associated with set(s) of evaluated levels 214 and/or set(s) of comparatively balanced levels 216 associated with audio data 302. In one possible aspect, all or some of metadata 304 can be stored in a header 306 associated with audio file 138. All or part of header 306 can be stored in audio file 138 and/or in an external library or other structure associated with audio file 138.

In one possible embodiment, information associated with set(s) of evaluated levels 214 and/or set(s) of comparatively balanced levels 216 associated with audio data 302 can be stored anywhere in audio file 138, including outside of metadata 304 and/or header 306. Moreover, in some implementations, one or more of audio files 138 may not have any information associated with set(s) of evaluated levels 214 and/or set(s) of comparatively balanced levels 216 associated with audio data 302. In such cases, such information can be created and associated with the corresponding audio files 138 using any of the techniques described herein. This can include creating headers 306 and metadata 304 in audio files 138 in which headers 306 and metadata 304 are not already present.

It can also include creating and/or using such information on the fly (i.e. in real-time). For example, in instances where a real-time audio stream of audio data is being processed (such as, for instance, a telecommunications signal, one or more people talking and/or singing into a microphone, etc.) the real-time stream of audio data can be compared against a set of reference levels 220 desirable to a user. In one possible implementation, the set of reference levels 220 could correspond to levels that make human speech in the real-time stream of audio data easier for a user to understand, more interesting for the user to listen to, etc. Further, several sets of reference levels 220 can exist for a variety of different possible users (such as, for example, a set of reference levels 220 for a woman's voice, a set of reference levels 220 for a man's voice, a set of reference levels 220 for a female child's voice, a reference set of reference levels 220 for a male child's voice, etc.).

In one possible embodiment, a response of the real-time stream of audio data can be caused to conform to the set of reference levels 220 using various techniques of comparative balancing described herein, such as for example by creating one or more set(s) of evaluated levels 214 and one or more set(s) of comparatively balanced levels 216. In one possible aspect, given the transitory nature of the real-time stream of audio data, the set(s) of evaluated levels 214 and/or set(s) of comparatively balanced levels 216 associated with real-time stream of audio data may not be saved anywhere.

Figure 4:
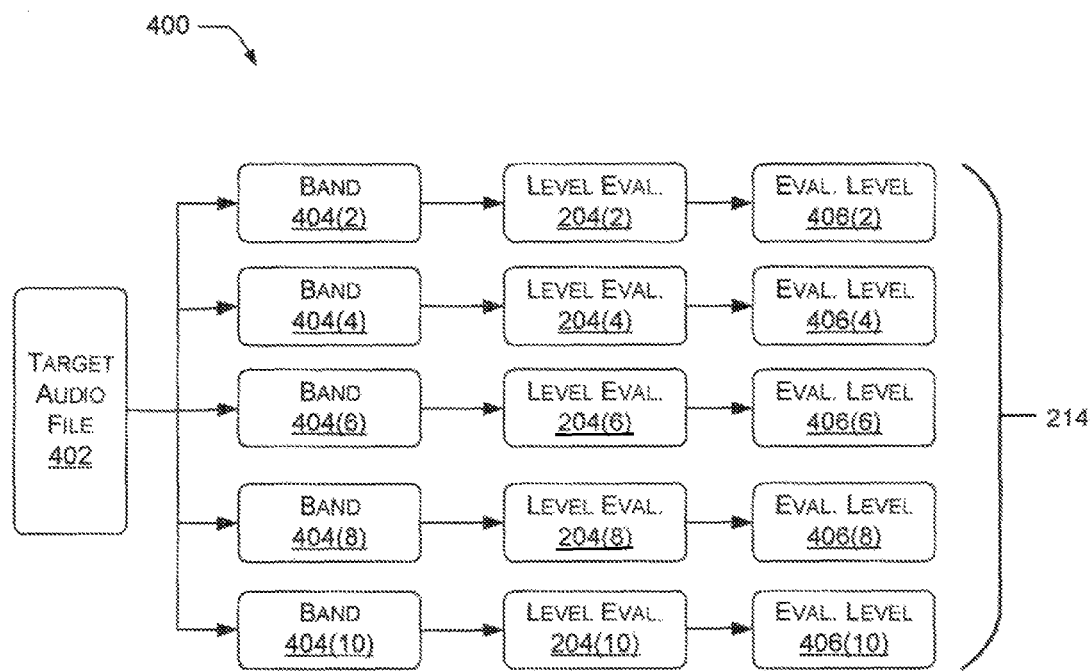
FIG. 4 illustrates an example methodology by which a set of evaluated levels can be isolated for an audio file in accordance with various embodiments of comparative balancing.

FIG. 4 illustrates example methodology 400 by which a set of evaluated levels 214 can be isolated for an audio file 138. For example, if a set of evaluated levels 214 associated with an audio file 138 cannot be found, then one can be created (including in real-time, for example) using methodology 400. In one possible instance this can be implemented wholly or partly by, for example, level evaluator 204.

In one possible embodiment, when device 100 interacts with an audio file 138 (such as, for example, when audio file 138 is being: downloaded to device 100, manipulated/played on device 100, stored on device 100, transmitted from device 100, streamed to and/or from device 100, received by device 100, etc.) audio file 138 can be examined for a corresponding set of evaluated levels 214. In one possible aspect, once an audio file 138 is chosen for interaction (such as by a user wishing to play audio file 138 and/or automatically by functionality on device 100 for any of a variety of possible purposes) audio file 138 can be termed a target audio file 402.

Target audio file 402 can be examined to determine level information associated with a preset number of frequency bands 404. For example, all or part of audio data 302 associated with target audio file 402 can be scanned in order to isolate/create a representative level for each frequency band 404 in audio data 302. For instance, all or part of level evaluator 204 (such as an envelope follower and/or other device that can perform spectral energy detection, etc.) can be used to measure each frequency band 404 (i.e. measure the energy from target audio file 402 in each frequency band 404) and isolate a representative energy level for each frequency band 404, resulting in an individual evaluated level 406 associated with each frequency band 404.

In one possible implementation, each evaluated level 406 can be an average (long-term average, short-term average, etc.) of the level of a corresponding frequency band 404, created in any way known in the art. For instance, in one possible implementation, the whole of audio data 302 in target audio file 402 can be used to create an average level to be used in determining evaluated level 406. Alternately, or additionally, an abbreviated portion of audio data 302 in target audio file 402 can be used to create an average level to be used in determining evaluated level 406. In still another possible implementation, two or more temporally non-contiguous portions of target audio file 402 (i.e. such as, for example, a 30 second portion at a beginning and a 30 second portion at an end of a song associated with audio data 302 in target audio file 402) can be examined to find a non-continuous average used in determining an evaluated level 406 associated with each frequency band 404.

In still another possible implementation—such as, for example, in association with a real-time stream of audio (such as an audio signal received on a phone and/or via a microphone, etc.)—the real-time stream of audio can be monitored for any desired period of time to determine the evaluated level 406 associated with each frequency band 404 on the fly (i.e. in real-time). In one possible aspect, this can include, for example, monitoring the real-time stream of audio for several seconds to determine the evaluated level 406 associated with each frequency band 404.

In another possible aspect, this can include, for example, monitoring the real-time stream of audio throughout a duration of the real-time audio signal, periodically and/or continuously recalculating the evaluated level 406 associated with each frequency band 404. In such an aspect, a new set of evaluated levels 214 can be created periodically and/or continuously while the real-time stream of audio is being received/played.

In one possible aspect, all of the evaluated levels 406 associated with the various frequency bands 404 can comprise the set of evaluated levels 214 associated with target audio file 402. In one possible embodiment, once isolated, evaluated levels 406 and/or set of evaluated levels 214, along with information associated with frequency bands 404 (including, for example, the number of bands 404, the frequency range of each band 404, the correspondence of each band 404 with each evaluated level 406, etc.) can be stored, such as in target audio file 402, in metadata 304 associated with target audio file 402, and/or in header 306 associated with target audio file 402, etc. In some instances, structures such as metadata 304 and/or header 306 can be created if not already present, in order to store the various information described above in association with target audio file 402.

In one possible embodiment, as many sets of evaluated levels 214 as desired can be isolated for target audio file 402 and saved in association with target audio file 402 as described above. For example, if two sets of evaluated levels 214 are desired, a first set of evaluated levels 214 corresponding to five bands 404 can be isolated, as well as a second set of evaluated levels 214 associated with ten bands 404. Both the first set of evaluated levels 214 and the second set of evaluated levels 214 can be stored in association with target audio file 402 along with information associated with each set of evaluated levels 214 including, for example, information associated with their corresponding frequency bands 404 (including, for example, the number of bands 404, the frequency range of each band 404, the correspondence of each band 404 with each evaluated level 406, etc.). In one possible aspect, such information can be stored anywhere in target audio file 402, including in metadata 304 associated with target audio file 402, and/or in header 306 associated with target audio file 402, etc.

It will be understood that any number and/or configuration of frequency bands 404 known in the art can be used in methodology 400 and can be configured in any way desired. For instance, in one possible embodiment, a restaurant or other business desiring a high level of consistency in background music being played may desire ten or more frequency bands 404.

In another possible implementation, when target audio file 402 comprises a real-time stream of audio (such as, for instance, a telecommunications signal, one or more people talking and/or singing into a microphone, etc.) the number of frequency bands 404 (and the frequency ranges of each individual frequency band 404) can be chosen to cover the normal frequency range of human speech.

As illustrated in the embodiment shown in FIG. 4, five frequency bands 404 are present covering a range of frequencies. In one possible implementation, a user could, for instance, define frequency band 404(2) to cover low frequencies in audio data 302, such as, for example, from 20-200 hz. Similarly frequency band 404(4) could be defined to cover low-mid frequencies in audio data 302, such as, for example, from 200-500 hz. Frequency band 404(6) could be defined to cover mid frequencies in audio data 302, such as, for example, from 500-2000 hz. Frequency band 404(8) could be defined to cover high-mid frequencies in audio data 302, such as, for example, from 2000-5000 hz. And frequency band 404(10) could be defined to cover high frequencies in audio data 302, such as, for example, from 5000 hz on up.

In one possible implementation, a set of reference bands 404 and levels associated therewith can be set by, for example, a user. For instance, perhaps a user has found a particular template of equalization to be pleasurable, effective, efficient, etc. As discussed above, the number and range of the various frequency bands 404 can be set in any way desirable and once the various frequency bands 404 and their properties are defined (by a user, by a convention, automatically, etc.), a corresponding set of reference levels 220 can also be defined.

Similarly, desirable reference levels can be set for each frequency band 404 in any manner known in the art including, for example, by hand (such as by using a graphic equalizer, etc.), automatically, by designating/choosing an audio file 138 that the user would like to use as a template audio file, by taking an average of a set of evaluated levels 214 associated with one or more audio files 138 in a playlist, etc.

Figure 5:
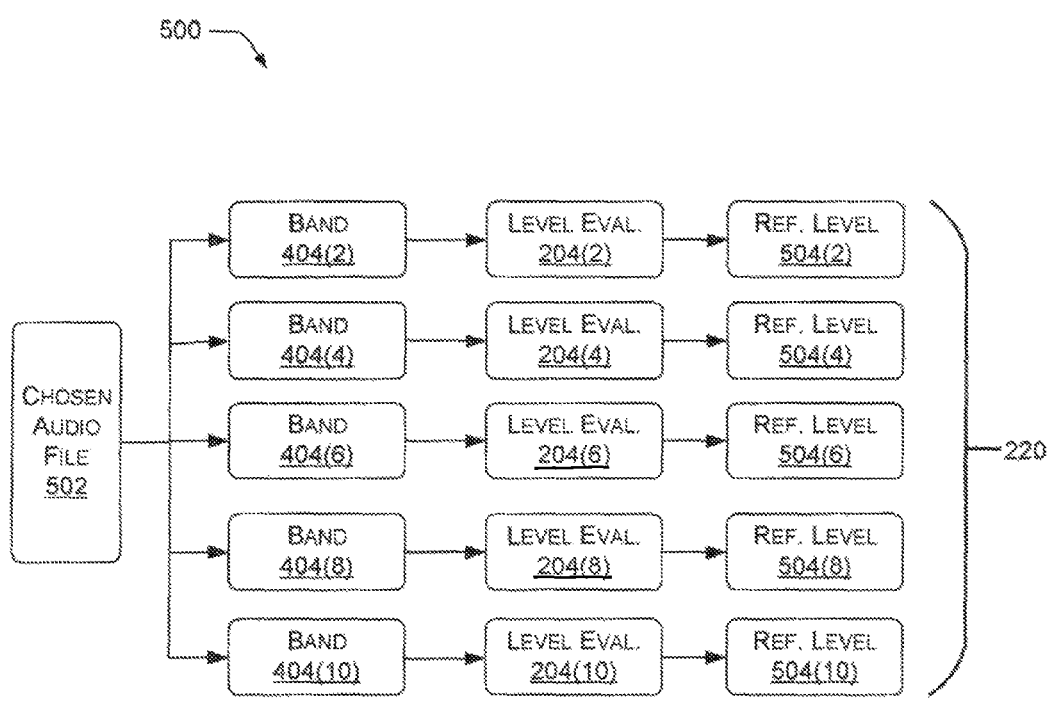
FIG. 5 illustrates an example methodology by which a set of reference levels can be isolated from an audio file in accordance with various embodiments of comparative balancing.

FIG. 5 illustrates an example methodology 500 by which a set of reference levels 220 can be isolated from an audio file 138 in accordance with various embodiments of comparative balancing. In one possible implementation, a user interacting with device 100 can select an audio file 138 with desirable levels, indicating that the levels of audio file 138 be isolated and used as set of reference levels 220. In one possible aspect, the audio file 138 selected by the user can be termed the chosen audio file 502. Methodology 500 can then be used in a manner similar to methodology 400 to extract from chosen audio file 502 various reference levels 504 corresponding to the various preset frequency bands 404, such that all of the reference levels 504 taken together can form set of reference levels 220.

For instance, using any of the techniques described above, a level evaluator 204(2) can isolate an average level of a first frequency band 404(2) in audio data 302 of chosen audio file 502. This average level can be termed the reference level 504(2) for the first frequency band 404(2). In a similar manner, unique reference levels 504 corresponding to each of the other frequency bands 404 can be isolated and taken together, all of the reference levels 504 can comprise the set of reference levels 220 associated with chosen audio file 502.

As discussed above, the number and range of the various frequency bands 404 can be set in any way desirable.

Regardless of how it is arrived at, once set of reference levels 220 is isolated, it can be used to comparatively balance the levels of various audio files 138, via, for example, analysis of spectral energy in frequency bands 404 associated with the audio files 138.

Figure 6:
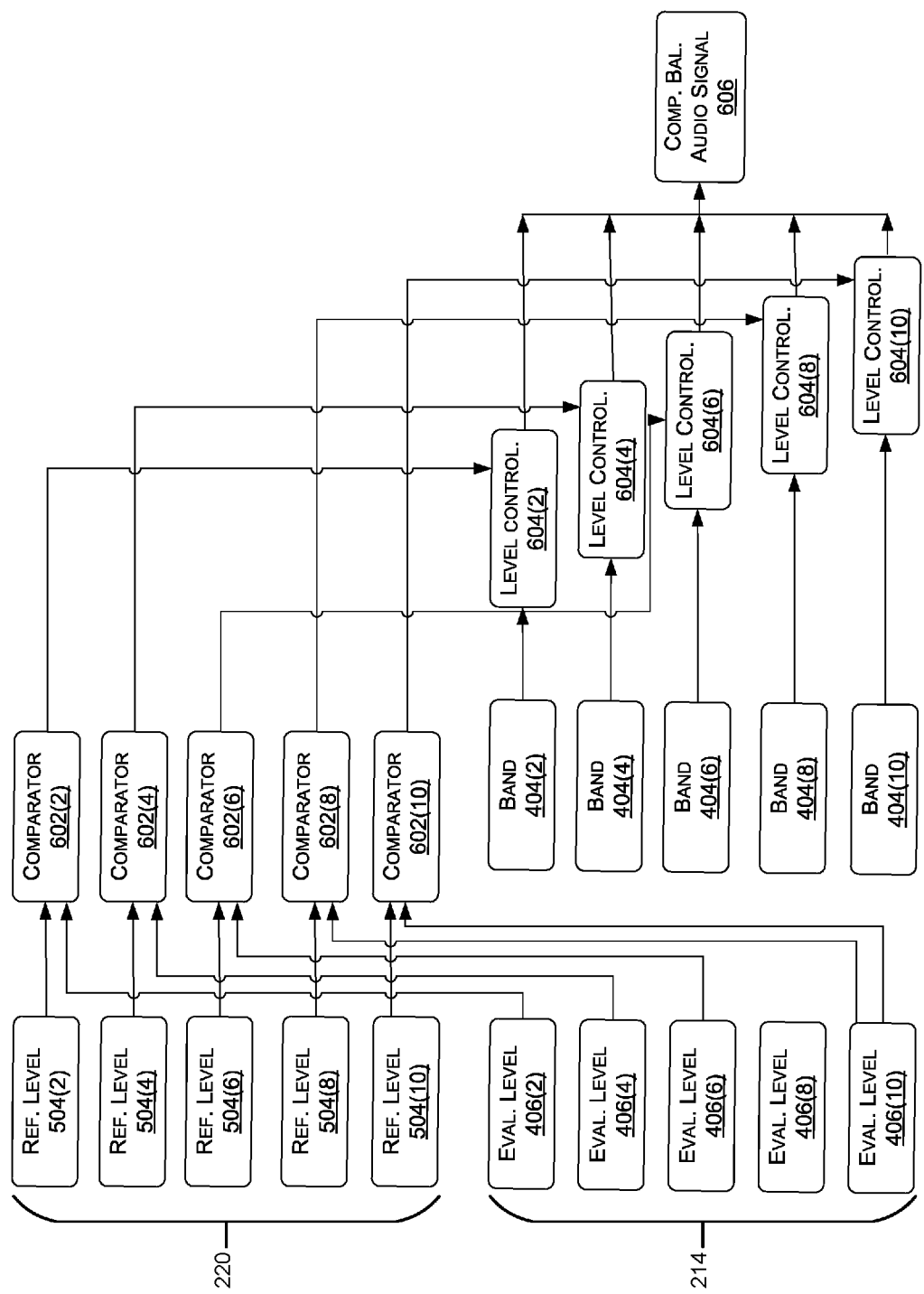
FIG. 6 illustrates example comparative balancing functionality associated with various embodiments of level comparative balancing.

FIG. 6 illustrates example comparative balancing functionality associated with various embodiments of comparative balancing. For instance, once target audio file 402 is chosen for playback (by a user, by its order on a playlist, etc.), or received (in the instance of a real-time stream of audio, such as, for instance, a telecommunications signal, one or more people talking and/or singing into a microphone, etc.), evaluated levels 406 in target audio file 402 for each band 404 can be compared with preset/preselected reference levels 504 in one or more comparators 602. In one possible implementation, evaluated levels 406 can have been previously isolated for target audio file 402 and can be accessed from target audio file 402, including from metadata 304 associated with target audio file 402, and/or from header 306 associated with target audio file 402, etc. In other implementations, evaluated levels 406 can be determined on the fly (i.e. in real-time) using any of the various methods described herein. For instance, in one possible aspect, such as when, for example, target audio file 402 comprises a real-time stream of audio, a few seconds of the real-time audio stream may be monitored to arrive at evaluated levels 406 associated with the real-time stream of audio.

At comparators 602, which can be configured using software, hardware, or any combination thereof known in the art, the reference level 504 and the evaluated level 406 for each band 404 can be compared and differences isolated. For example, comparator 602(2) can compare reference level 504(2) with evaluated level 406(2). For the sake of illustration, and not limitation, if it is assumed that reference level 504(2) has a value of 5 and evaluated level 406(2) has a value of 3, then comparator will note a difference of +2 between the two. Alternately, if it is assumed that reference level 504(2) has a value of 1 and evaluated level 406(2) has a value of 5, then comparator will note a difference of −4 between the two.

In such a manner differences for all of the reference level 504 and evaluated level 406 pairs associated with each band 404 can be transmitted to corresponding level controllers 604 associated with each band 404. The level controllers 604 can then use the difference information from the comparators 602 to boost or drop actual levels associated with each frequency band 404 from the target audio file 402 as the target audio file 402 is played to produce a comparatively balanced audio signal 606 with comparatively balanced levels.

For example, returning to our hypothetical scenario from above, if reference level 504(2) has a value of 1 and evaluated level 406(2) has a value of 5, then comparator 602(2) can transmit a difference of −4 to level controller 604(2). Level controller 604(2) can in turn drop the actual level corresponding to band 404(2) by 4, thus comparatively balancing the actual level associated with band 404(2) as it is played from target audio file 402. In some implementations, such a comparatively balanced level formed from the actual level will at least approximate the corresponding reference level 504(2) for the band 404(2).

In such a manner comparators 602 and level controllers 604 associated with each band 404 can comparatively balance the actual levels of each band 404 in the audio signal being played from target audio file to result in the comparatively balanced audio signal 606.

In one possible implementation, the amount of comparative balancing of the audio signal from target audio file 402 that takes place due to comparators 602 and level controllers 604 can be controlled by, for example, a user. For example, during playback of target audio file 402, a user can be provided with an interface, such as a cross fader, allowing the user to determine an amount of fade between actual levels associated with the one or more preset frequency bands 404 of the target audio file 402 and reference levels 504 (i.e. an amount of comparative balancing of actual levels of the various bands 404 in the target audio file relative to reference levels 504). For instance, if the user chooses zero percent comparative balancing, then comparatively balanced audio signal 606 will be played with the actual levels of the various bands 404 in target audio file 402 with no comparative balancing at all. Alternately, if the user chooses 100 percent comparative balancing, then comparatively balanced audio file 606 will be played with fully comparatively balanced levels (of the actual levels) of the bands 404. Using such an interface, the user can choose any desired percentage of comparative balancing of the actual levels of target audio file 402.

Practitioners skilled in the art will recognized that by comparatively balancing the actual levels of target audio file 402 using the techniques of comparative balancing described herein, the tones associated with target audio file 402 will also be similarly comparatively balanced.

Example Method(s)

Figure 7:
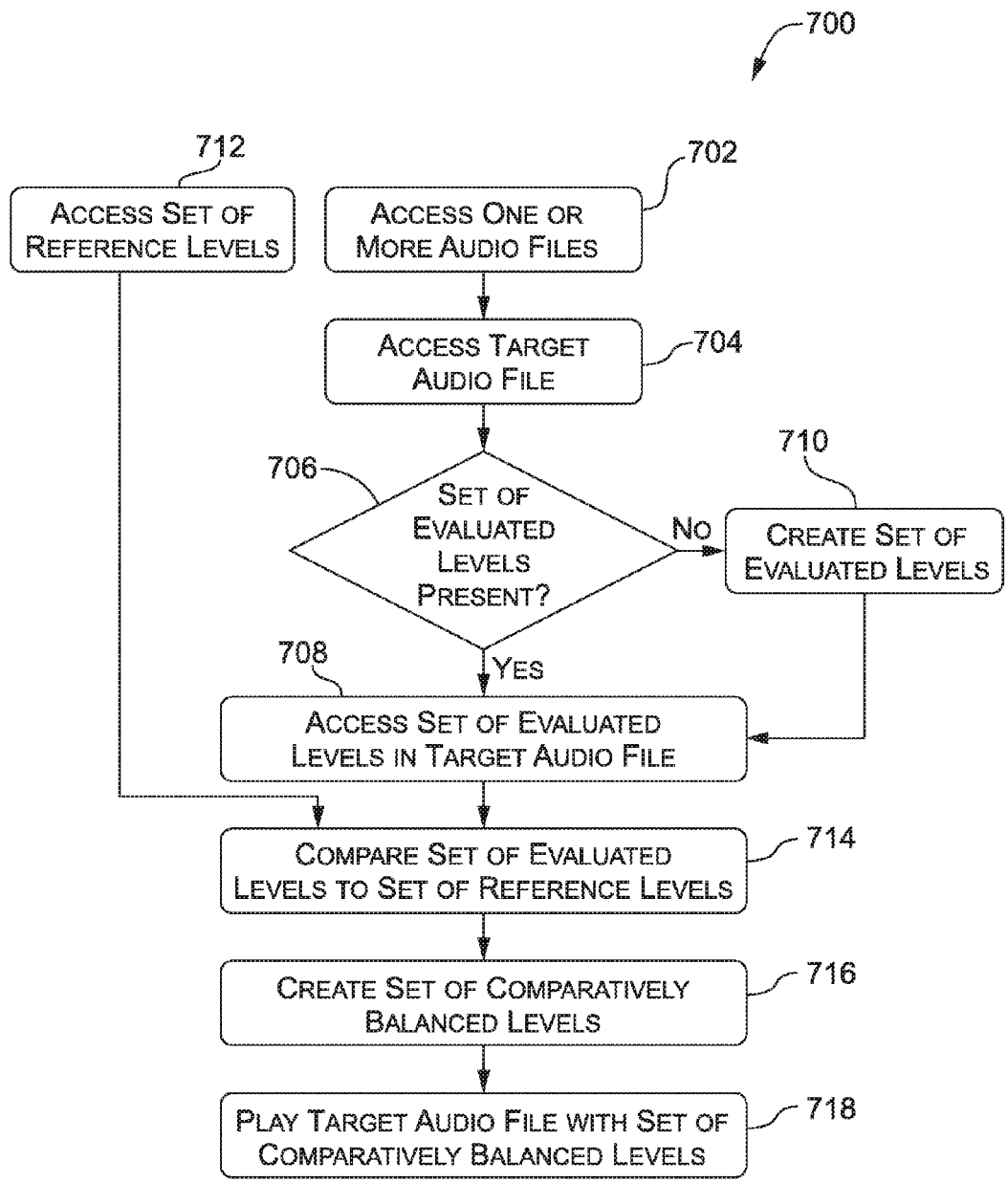
FIG. 7 illustrates example method(s) associated with various embodiments of comparative balancing.

FIG. 7 illustrates example method(s) 700 for implementing aspects of comparative balancing. The methods are illustrated as a collection of blocks and other elements in a logical flow graph representing a sequence of operations that can be implemented in hardware, software, firmware, various logic or any combination thereof. The order in which the methods are described is not intended to be construed as a limitation, and any number of the described method blocks can be combined in any order to implement the methods, or alternate methods. Additionally, individual blocks and/or elements may be deleted from the methods without departing from the spirit and scope of the subject matter described therein. In the context of software, the blocks and other elements can represent computer instructions that, when executed by one or more processors, perform the recited operations. Moreover, for discussion purposes, and not purposes of limitation, selected aspects of the methods may be described with reference to elements shown in FIGS. 1-6.

At block 702 one or more audio files (such as audio files 138) are accessed. These can include, for example, audio files organized and/or grouped in any manner known in the art, such as in an album, playlist, etc. The one or more audio files can also include a real-time stream of audio.

At block 704 a target audio file (such as target audio file 402) is chosen from the one or more audio files in any way known in the art. For example, a user may hand choose the target audio file from the one or more audio files. Alternately, or additionally, the target file can be chosen automatically, such as when its location in a playlist comes up while the playlist is being played.

At block 706, the target file is scanned for information associated with a set of evaluated levels (such as set of evaluated levels 214) associated with the target audio file. This can include individual evaluated levels (such as evaluated levels 406) associated with one or more frequency bands (such as frequency bands 404) as well as information associated with the bands themselves, such as a frequency range of each frequency band, a number of frequency bands, etc.

Information associated with the set of evaluated levels can be found in a variety of places associated with the target audio file including, for example, in metadata (such as metadata 304) associated with the target file, and/or in a header (such as header 306) associated with the target file, etc. Once information associated with a set of evaluated levels is found, method 700 can proceed to block 708.

Alternately, if no information associated with a set of evaluated levels is found, method 700 can proceed to block 710 where a set of evaluated levels can be created for the target audio file. In one possible aspect, the set of evaluated levels can be created at block 710 using any of the methods described in conjunction with FIG. 4. This can include creating the set of evaluated levels on the fly (i.e. in real-time), such as, for example, when the target audio file is a real-time stream of audio.

Once a set of evaluated levels for the target file is created at block 710, method 700 can proceed to block 708

At block 708, the set of evaluated levels for the target file (either found at block 706 or created at block 710) is accessed.

At block 712, a set of reference levels (such as set of reference levels 220) is accessed. The set of reference levels can, for example, be saved on an audio device (such as device 100) on which the target audio file is being played, and can come from one or more of a variety of sources, as described above. For example, the set of reference levels can be defined by a user in any way known in the art, including through use of a graphic equalizer, by designating an audio file the user likes and extracting level information from it to be used as the set of reference levels (such as described in the methods explained in conjunction with FIG. 5), etc. Further, the set of reference levels can be created as an average of levels in two or more audio files in a playlist, etc.

At block 714 the set of reference levels can be compared to the set of evaluated levels for the target audio file to assess differences between the set of reference levels and the set of evaluated levels. In one possible implementation this can be accomplished using a comparator (such as comparator 602).

At block 716, the comparison of the set of reference levels to the set of evaluated levels is used to create a set of comparatively balanced levels for the target audio file. For example, in comparing a reference level associated with a given frequency band with an evaluated level associated with that same frequency band, a difference between the reference level and the evaluated level can be calculated. This can be done for each frequency band in use.

In such a manner differences for all of the pairs of reference levels (such as reference levels 504) and evaluated levels (such as evaluated levels 406) associated with each frequency band (such as bands 404) can be isolated and transmitted to level controllers (such as level controllers 604) associated with each frequency band. The level controllers can then use the difference information from the comparators to boost or drop actual levels of the target audio file associated with each frequency band as the target audio file is played in order to produce a comparatively balanced audio signal with comparatively balanced levels for each frequency band.

For example, in a hypothetical scenario for purposes of illustration and not limitation, if a reference level associated with a given frequency band has a value of 1 and an evaluated level associated with the same given frequency band has a value of 5, then the comparator can transmit a difference of −4 to the level controller for the given frequency band. The level controller can then drop the actual level of the target file being played corresponding to the given frequency band by 4 such that it will be comparatively balanced to 1. This can be done for all the actual levels corresponding to each frequency band in the target audio file to create a plurality of comparatively balanced audio signals with comparatively balanced levels which may at least approximately corresponding to the reference levels for each frequency band in the target audio file.

At block 718, the set of comparatively balanced levels can be used to create a comparatively balanced audio file (such as comparatively balanced audio file 606) by playing the target audio file using the set of comparatively balanced levels created in block 716.

Although a few example embodiments have been described in detail above, those skilled in the art will readily appreciate that many modifications are possible in the example embodiments without materially departing from this disclosure. Accordingly, such modifications are intended to be included within the scope of this disclosure as defined in the following claims. Moreover, embodiments may be performed in the absence of any component not explicitly described herein.

In the claims, means-plus-function clauses are intended to cover the structures described herein as performing the recited function and not just structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, using "and" or "or" is intended to include "and/or" unless specifically indicated otherwise. The illustrative embodiments may be implemented as a method, apparatus, or article of manufacture using standard engineering techniques.

Illustrative Embodiments

The following embodiments are illustrative and are not intended to limit the scope of the disclosed subject matter.

Embodiment 1

A computer-readable tangible medium with instructions stored thereon that, when executed, direct a processor to perform acts comprising:
   accessing a set of reference levels associated with one or more preset frequency bands;
   accessing a target audio file;
   accessing a set of evaluated levels of the one or more preset frequency bands associated with the target audio file;
   isolating one or more differences between the set of evaluated levels and the set of reference levels;
   utilizing the one or more differences to alter a set of actual levels of the one or more preset frequency bands of the target audio file to create a set of comparatively balanced levels of the one or more preset frequency bands of the target audio file, which at least approximates the set of reference levels; and playing the target audio file using the set of comparatively balanced levels to create a comparatively balanced audio signal.

Embodiment 2

The computer-readable medium of embodiment 1, further including instructions to direct a processor to perform acts comprising:
   allowing a user to designate a chosen audio file as a template audio file; and
   designating an average set of levels of the one or more preset frequency bands associated with the chosen audio file as the set of reference levels.

Embodiment 3

The computer-readable medium of embodiment 2, further including instructions to direct a processor to perform acts comprising:

creating the set of reference levels associated with the one or more preset frequency bands in the template audio file by one or more of:
  generating a long-term average of levels associated with the one or more preset frequency bands in the chosen audio file;
  generating a short-term average of levels associated with the one or more preset frequency bands in the chosen audio file;
  generating a non-continuous average of levels associated with the one or more preset frequency bands in the chosen audio file through use of two or more temporally non-continuous samples of the chosen audio file.

Embodiment 4

The computer-readable medium of embodiment 1, further including instructions to direct a processor to perform acts comprising:
  creating at least a portion of the set of reference levels from a second set of levels associated with the one or more preset frequency bands entered by a user.

Embodiment 5

The computer-readable medium of embodiment 1, further including instructions to direct a processor to perform acts comprising:
  accessing the set of evaluated levels from a first set of metadata associated with the target audio file.

Embodiment 6

The computer-readable medium of embodiment 1, further including instructions to direct a processor to perform acts comprising:
  creating the set of evaluated levels associated with the one or more preset frequency bands in the target audio file by one or more of:
    generating a long-term average of levels associated with the one or more preset frequency bands in the target audio file;
    generating a short-term average of levels associated with the one or more preset frequency bands in the target audio file;
    generating a non-continuous average of levels associated with the one or more preset frequency bands in the target audio file through use of two or more temporally non-continuous samples of the target audio file.

Embodiment 7

The computer-readable medium of embodiment 1, further including instructions to direct a processor to perform acts comprising:
  accessing the target audio file by accessing a real-time stream of audio; and
  accessing the set of evaluated levels by monitoring the real-time stream of audio for a desired period of time.

Embodiment 8

An audio device comprising:
  one or more processors; and
  a computer-readable tangible medium with instructions stored thereon that, when executed, direct the one or more processors to perform acts comprising:
    accessing a set of evaluated levels associated with one or more preset frequency bands in a target audio file;
    creating a set of comparatively balanced levels associated with one or more preset frequency bands in the target audio file by comparatively balancing a set of actual levels associated with the one or more preset frequency bands in the target audio file to at least approximate a set of reference levels associated with the one or more preset frequency bands in a reference template.

Embodiment 9

The audio device of embodiment 8, wherein the computer-readable medium further includes instructions to direct the one or more processors to perform acts comprising:
  allowing a user to designate a chosen audio file as a template audio file;
  designating a set of levels of the one or more preset frequency bands associated with the chosen audio file as the set of reference levels.

Embodiment 10

The audio device of embodiment 9, wherein the computer-readable medium further includes instructions to direct the one or more processors to perform acts comprising:
  creating the set of reference levels associated with the one or more preset frequency bands in the template audio file by one or more of:
    generating a long-term average of levels associated with the one or more preset frequency bands in the chosen audio file;
    generating a short-term average of levels associated with the one or more preset frequency bands in the chosen audio file;
    generating a non-continuous average of levels associated with the one or more preset frequency bands in the chosen audio file through use of two or more temporally non-continuous samples of the chosen audio file.

Embodiment 11

The audio device of embodiment 8, wherein the computer-readable medium further includes instructions to direct the one or more processors to perform acts comprising:
  allowing a user to enter a designated set of levels associated with the one or more preset frequency bands; and
  creating at least a portion of the set of reference levels from the designated set of levels.

Embodiment 12

The audio device of embodiment 8, wherein the computer-readable medium further includes instructions to direct the one or more processors to perform acts comprising:
  accessing the set of evaluated levels from a header associated with the target audio file.

Embodiment 13

The audio device of embodiment 8, wherein the computer-readable medium further includes instructions to direct the one or more processors to perform acts comprising:

creating the set of evaluated levels associated with the one or more preset frequency bands in the target audio file by generating an average of levels associated with the one or more preset frequency bands in the target audio file.

Embodiment 14

The audio device of embodiment 8, wherein the computer-readable medium further includes instructions to direct the one or more processors to perform acts comprising:
allowing a user during playback of the target audio file to interact with a cross fader to determine an amount of fade between the set of actual levels associated with the one or more preset frequency bands in the target audio file and the set of comparatively balanced levels associated with the one or more preset frequency bands in the target audio file Embodiment 15

An audio device comprising:
one or more processors; and
a computer-readable tangible medium with instructions stored thereon that, when executed, direct the one or more processors to perform acts comprising:
accessing a target audio file;
accessing a set of evaluated levels associated with one or more preset frequency bands in the target audio file;
creating a set of comparatively balanced levels by comparatively balancing a set of actual levels associated with the one or more preset frequency bands in the target audio file to at least approximate a set of reference levels associated with the one or more preset frequency bands; and
playing the target audio file with the set of comparatively balanced levels.

Embodiment 16

The audio device of embodiment 15, wherein the computer-readable medium further includes instructions to direct the one or more processors to perform acts comprising:
accessing the set of evaluated levels associated with the one or more preset frequency bands in the target audio file by scanning metadata associated with the target audio file.

Embodiment 17

The audio device of embodiment 15, wherein the computer-readable medium further includes instructions to direct the one or more processors to perform acts comprising:
allowing a user to designate a chosen audio file as a template audio file;
designating a set of levels of the one or more preset frequency bands associated with the chosen audio file as the set of reference levels.

Embodiment 18

The audio device of embodiment 15, wherein the audio device comprises one or more of:
a public address system;
a hearing aid;
a telephone;
a speaker;
one or more headphones;
a computer;
a DJ control setup;
a musical instrument;
a television;
an internet-based music streaming service;
an entertainment system.

Embodiment 19

The audio device of embodiment 15, wherein the computer-readable medium further includes instructions to direct the one or more processors to perform acts comprising:
accessing the target audio file by accessing a real-time stream of audio; and
accessing the set of evaluated levels by monitoring the real-time stream of audio for a desired period of time.

Embodiment 20

The audio device of embodiment 15, wherein the computer-readable medium further includes instructions to direct the one or more processors to perform acts comprising:
detecting a new audio file being uploaded to the audio device;
determining a set of evaluated levels associated with the one or more preset frequency bands in the new audio file; and
associating the set of evaluated levels associated with the one or more preset frequency bands in the new audio file with a header in the new audio file.

The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated. It is intended that the scope of the disclosed subject matter be defined by the claims appended hereto and their equivalents.

What is claimed is:
1. A non-transitory computer-readable tangible medium with instructions stored thereon that, when executed, direct a processor to perform acts comprising:
accessing a template audio file;
determining a number of frequency bands for selection in the template audio file based on a background sound;
selecting the number of frequency bands in the template audio file and accessing a set of reference levels associated with the number of frequency bands selected;
accessing a target audio file;
creating a set of evaluated levels using the target audio file by generating a non-continuous average of level settings for two or more temporally non-continuous samples from the target audio file for each frequency band in the number of frequency bands in the target audio file corresponding to the number of frequency bands in the template audio file selected;

isolating one or more differences in the level settings between the set of evaluated levels and the set of reference levels;

utilizing the one or more differences in the level settings to alter a set of actual levels of the target audio file, the set of actual levels corresponding to the number of frequency bands in the template audio file selected;

creating a comparatively balanced audio signal for the target audio file using the altered set of actual levels, which at least approximates the set of reference levels; and directing the comparatively balanced audio signal to be played on an audio device when the target audio file is selected for playback to create a more uniform listening experience for a user.

2. The non-transitory computer-readable tangible medium of claim 1, further including instructions to direct a processor to perform acts comprising:

allowing a user to designate a chosen audio file as the template audio file.

3. The non-transitory computer-readable tangible medium of claim 1, further including instructions to direct a processor to perform acts comprising:

creating the set of reference levels associated with the number of frequency bands selected by one or more of:
generating a long-term average of levels associated with the number of frequency bands in the template audio file;
generating a short-term average of levels associated with the number of frequency bands in the template audio file;
generating a non-continuous average of levels associated with the number of frequency bands in the template audio file through use of two or more temporally non-continuous samples of the template audio file.

4. The non-transitory computer-readable tangible medium of claim 1, further including instructions to direct a processor to perform acts comprising:

creating at least a portion of the set of reference levels from a second set of levels associated with the number of frequency bands entered by a user.

5. The non-transitory computer-readable tangible medium of claim 1, further including instructions to direct a processor to perform acts comprising:

accessing the target audio file by accessing a real-time stream of audio; and creating the set of evaluated levels by monitoring the real-time stream of audio for a desired period of time.

6. An audio device comprising:
one or more processors;
one or more output devices; and
a non-transitory computer-readable tangible medium with instructions stored thereon that, when executed, direct the one or more processors to perform acts comprising:
accessing a template audio file;
determining a number of frequency bands for selection in the template audio file based on a background sound;
selecting the number of frequency bands in the template audio file and accessing a set of reference levels associated with the number of frequency bands selected;
accessing a target audio file;
creating a set of evaluated levels using the target audio file by generating a non-continuous average of level settings for two or more temporally non-continuous samples from the target audio file for each frequency band in the number of frequency bands in the target audio file corresponding to the number of frequency bands in the template audio file selected;
isolating one or more differences in the level settings between the set of evaluated levels and the set of reference levels;
utilizing the one or more differences in the level settings to alter a set of actual levels of the target audio file, the set of actual levels corresponding to the number of frequency bands in the template audio file selected;
creating a comparatively balanced audio signal for the target audio file using the altered set of actual levels, which at least approximates the set of reference levels; and
directing the comparatively balanced audio signal to be played on at least one of the one or more output devices when the target audio file is selected for playback to create a more uniform listening experience for a user.

7. The audio device of claim 6, wherein the non-transitory computer-readable tangible medium further includes instructions to direct the one or more processors to perform acts comprising:

allowing a user to designate a chosen audio file as the template audio file.

8. The audio device of claim 7, wherein the non-transitory tangible computer-readable tangible medium further includes instructions to direct the one or more processors to perform acts comprising:

creating the set of reference levels associated with the number of frequency bands selected by one or more of:
generating a long-term average of levels associated with the number of frequency bands in the template audio file;
generating a short-term average of levels associated with the number of frequency bands in the template audio file;
generating a non-continuous average of levels associated with the number of frequency bands in the template audio file through use of two or more temporally non-continuous samples of the template audio file.

9. The audio device of claim 6, wherein the non-transitory computer-readable tangible medium further includes instructions to direct the one or more processors to perform acts comprising:

allowing a user to enter a designated set of levels associated with the number of frequency bands selected; and creating at least a portion of the set of reference levels from the designated set of levels.

10. The audio device of claim 6, wherein the non-transitory computer-readable tangible medium further includes instructions to direct the one or more processors to perform acts comprising:

allowing a user during playback of the target audio file to interact with a cross fader to determine an amount of fade between the set of actual levels associated with the number of frequency bands in the target audio file and a set of comparatively balanced levels associated with the number of frequency bands in the target audio file.

11. The audio device of claim 6, wherein the audio device comprises one or more of:
a public address system;
a hearing aid;

a telephone;
a speaker;
one or more headphones;
a computer;
a DJ control setup;
a musical instrument;
a television;
an internet-based music streaming service;
an entertainment system.

12. A computer-implemented method for processing a target audio file comprising:
  accessing a template audio file;
  determining a number of frequency bands for selection in the template audio file based on a background sound;
  selecting the number of frequency bands in the template audio file and accessing a set of reference levels associated with the number of frequency bands selected;
  accessing the target audio file;
  creating a set of evaluated levels using the target audio file by generating a non-continuous average of level settings for two or more temporally non-continuous samples from the target audio file for each frequency band in the number of frequency bands in the target audio file corresponding to the number of frequency bands in the template audio file selected;
  isolating one or more differences in the level settings between the set of evaluated levels and the set of reference levels;
  utilizing the one or more differences in the level settings to alter a set of actual levels of the target audio file, the set of actual levels corresponding to the number of frequency bands in the template audio file selected;
  creating a comparatively balanced audio signal for the target audio file using the altered set of actual levels, which at least approximates the set of reference levels; and
  directing the comparatively balanced audio signal to be played on an audio device when the target audio file is selected for playback to create a more uniform listening experience for a user.

13. The method for processing a target audio file of claim 12, further comprising:
  allowing a user to designate a chosen audio file as the template audio file.

14. The method for processing a target audio file of claim 12, further comprising:
  accessing the target audio file by accessing a real-time stream of audio; and
  creating the set of evaluated levels by monitoring the real-time stream of audio for a desired period of time.

15. The method for processing a target audio file of claim 12, wherein accessing the target audio file comprises:
  detecting a new audio file being uploaded to an audio device.

* * * * *